United States Patent [19]

Lee

[11] Patent Number: 5,760,594

[45] Date of Patent: Jun. 2, 1998

[54] CONTAMINATION MONITORING USING CAPACITANCE MEASUREMENTS ON MOS STRUCTURES

[75] Inventor: Henry Lee, San Francisco, Calif.

[73] Assignee: VLSI Technology, Inc., San Jose, Calif.

[21] Appl. No.: 723,021

[22] Filed: Sep. 30, 1996

[51] Int. Cl.$^6$ ................................................. G01R 15/12
[52] U.S. Cl. ................................................. 324/663; 324/765
[58] Field of Search ................................ 324/719, 663, 324/671, 681, 759, 765, 769

[56] References Cited

U.S. PATENT DOCUMENTS

| | | | |
|---|---|---|---|
| 3,840,869 | 10/1974 | Yun | 324/765 |
| 3,889,188 | 6/1975 | Trindade | 324/769 |
| 3,943,442 | 3/1976 | Fletcher et al. | 324/765 |
| 4,977,371 | 12/1990 | Oliver, Jr. et al. | 324/765 |
| 5,237,266 | 8/1993 | Endredi et al. | 324/719 |
| 5,444,389 | 8/1995 | Hirae et al. | 324/765 |
| 5,453,994 | 9/1995 | Kawamoto et al. | 324/765 |
| 5,581,248 | 12/1996 | Spillman, Jr. | 324/769 |
| 5,625,288 | 4/1997 | Snyder et al. | 324/763 |
| 5,627,479 | 5/1997 | Viscor et al. | 324/663 |

OTHER PUBLICATIONS

Horanyi, et al., Identification Possibility of Metallic Impurities in p–Type Silicon by Lifetime Measurement, Jan. 1996, J. Electrochem. Soc., vol. 143, No. 1.

Howland, et al., Errors and Error–Avoidance in the Schottky Coupled Surface Photovoltage Technique, Dec. 1995, J. Electrochem. Soc., vol. 142, No. 12.

Jastrzebski, et al., Monitoring of Heavy Metal Contamination during Chemical Cleansing with Surface Photovoltage, Apr. 1993, J. Electrochem. Soc., vol. 140, No. 4.

Primary Examiner—Maura K. Regan
Attorney, Agent, or Firm—Hickman Beyer & Weaver

[57] ABSTRACT

A method for monitoring contamination in a semiconductor wafer uses a capacitance-frequency measurement on MOS structures to calculate an impurity concentration. The silicon substrate along with an oxide layer is first biased into the inversion region using a variable frequency waveform generator superimposed upon a DC voltage bias. Next, the capacitance of the wafer is measured as a function of the varying frequency in order to develop a capacitance versus frequency curve. From this frequency response, a bandwidth (BW) is measured at a particular normalized capacitance point. The impurity concentration N is then derived using the formula N=G×BW, where G is the correlation constant. With an a priori knowledge of impurity concentration, N, the constant G may be derived by measuring a bandwidth of the capacitance versus frequency curve. Once the constant G is determined, future evaluation of impurity concentration can be made by a capacitance measurement. The method can be used on finished product wafers or as a routine monitoring tool on pre-processed wafers.

22 Claims, 5 Drawing Sheets

CONTAMINATION MONITORING USING CAPACITANCE MEASUREMENTS ON MOS STRUCTURES

FIELD OF THE INVENTION

The present invention relates generally to the fabrication of semiconductor devices and, more specifically, the present invention relates to techniques for monitoring impurities in a semiconductor.

BACKGROUND OF THE INVENTION

Impurities that contaminate a semiconductor substrate during its fabrication are a major source of device reliability problems. In particular, transition metal contaminants have, for example, been identified as a cause of premature gate oxide degradation. For example, metals such as Iron, Copper and Aluminum can be contaminants. Various techniques are used to monitor these contaminants either before a semiconductor wafer (such as a silicon wafer) is processed, or to monitor contaminants after a wafer has been processed to create one or more integrated circuits. A discussion of semiconductor materials and devices may be found in "Semiconductor Material and Device Characterization" by D. K. Schroder, 1990, J. Wiley and Sons. Certain techniques do not attempt to measure the level of metallic contaminants directly, but instead rely upon more readily measured quantities that can be correlated to the level of contaminants. These techniques are widely used because they are simple to implement.

For example, metallic contamination in silicon decreases the carrier generationrecombination lifetime in the silicon wafer. This is because metals are efficient generationrecombination centers since their ionization energies are near the middle of the band gap. Thus, a measurement of carrier lifetimes in silicon is directly correlated to the level of metallic contamination.

Measuring carrier lifetimes is widely accepted for metallic contamination monitoring. However, it is an indirect method of evaluating contamination and first requires another method such as deep level transient spectroscopy (DLTS) to directly measure the concentration of impurities in order to determine a constant value to be used in later calculations of impurities. The measured carrier lifetime, $\tau$, can then be correlated to the directly measured impurity concentration, N, using the impurity concentration formula $N=\alpha/\tau$ where $\alpha$ is a correlation coefficient (a constant value). Once $\alpha$ is known, future monitoring of impurity contamination N can be made by simply measuring carrier lifetime $\tau$ and using the impurity concentration formula.

Carrier generation-recombination lifetime is typically measured optically as will be explained in detail subsequently. However the back surface of the semiconductor substrate can affect the accuracy of optical measurements for relatively thin wafers. To illustrate, for metallic concentrations on the order of $10^{11}$ atoms/cm$^2$, carrier lifetimes are approximately 100 μs. For a p-type silicon wafer with a resistivity of 6 Ω-cm, this will yield a diffusion length of 500 μm, which is nearly the thickness of a typical silicon wafer. As a result, many carriers will prematurely recombine at the back surface of the wafer instead of naturally within the body of the wafer, if the wafer were thicker. Thus, the measured carrier lifetime may be underestimated by as much as 200%, which also gives an inaccurate measurement for impurities.

FIG. 1 at 100 illustrates a prior art optical technique for measuring impurities in a silicon substrate. This optical technique is typically used to detect impurities in a wafer before processing, as light is generally not able to penetrate through a fully processed wafer. Shown is a silicon substrate 110, a light source 112 and a voltage measuring device 116. Silicon substrate 110 is a typical silicon wafer that has not yet been processed. Light source 112 is typically a laser or a halogen bulb that provides a pulsed light beam directed upon the silicon substrate 110.

A method for measuring metallic impurities using the apparatus of FIG. 1 is shown in FIG. 2. The method is performed by pulsing light upon the silicon substrate in order to generate carriers so that their lifetimes may be measured. In a first step 202, the light source is activated and photons from the light source 112 impinge upon the silicon substrate, exciting and generating the carriers within the substrate. The carriers in the silicon substrate may be electrons, "e", or holes "p". These carriers are self-biased and generally diffuse towards the back surface of the silicon substrate where there are fewer carriers. However, the carriers may travel in a different direction depending upon the material used for the substrate.

The voltage measuring device 116 measures the bias across the wafer in step 204 and reflects the carrier decay. That is, the decay rate of the voltage reflects the decay rate of carrier lifetime. The voltage measuring device 116 measures this decay and it is then possible to calculate an average lifetime for the carriers. Once this measured carrier lifetime $\tau$ has been determined, the impurity concentration formula $N=\alpha/\tau$ may be used to calculate the metallic contamination N.

However, this optical technique has certain disadvantages as described above. One disadvantage is that this technique cannot be used to measure impurities with a finished wafer. Often it is important to be able to measure impurities in a finished wafer because the fabrication process may have introduced these impurities. Also, this optical technique may result in inaccurate measurements when used on relatively thin wafers. That is, for a wafer that is relatively thin compared to the diffusion length of a carrier, the measured carrier lifetime $\tau$ may be inaccurate. An example of an inaccurate measurement will be discussed with reference to FIG. 1.

In FIG. 1, if the diffusion length of a carrier 101 is short compared to the depth of the wafer, the carrier 101 will decay and its lifetime will end at 102 before it reaches the back surface 104 of the wafer 110. In this case, the measured carrier lifetime will be an accurate measurement. However, for a carrier 103 which has a relatively long carrier diffusion length compared to the depth of the wafer 110, an inaccurate measurement of the carrier lifetime $\tau$ may result. That is, in this example, carrier 103 would normally be able to travel to point 105 (in a thicker wafer) and its lifetime would be longer. However, within a wafer that is relatively thin carrier 103 will prematurely recombine at the back surface 104 of the wafer 110 instead of recombining at a point 105 in the hypothetical thicker wafer. Thus, the actual measured lifetime for carrier 103 is less than its true potential lifetime. Therefore, because this measured lifetime $\tau$ is less than the true lifetime, when this value $\tau$ is used in a calculation of metallic impurities, the calculated value for metallic impurities will be inaccurate. Thus, although an optical technique for measuring impurities may be fast, it can result in inaccurate measurements for relatively thin wafers.

Electrical methods are also used to measure carrier lifetime in order to calculate the impurity concentration. Electrical methods do not have the problem with relatively thin wafers because the carriers are generated and recombined near the front surface of the wafer only. A value for carrier lifetimes can be extracted using a capacitance-time measurement on a semiconductor device, but requires close to 1000 seconds for a single measurement. This length of time may be too great for certain processing situations. This electrical method is described below with reference to FIGS. 3 and 4.

FIG. 3 at 130 illustrates a prior art electrical technique for measuring metallic impurities in a silicon substrate. The technique illustrated is a capacitance-time technique for measuring impurities in a silicon substrate 10 that has at least one oxide layer 120. The technique uses a square waveform generator 119 superimposed upon a DC bias 122. A capacitance measuring device 118 is used to measure the total capacitance across the silicon substrate and the oxide layer. This measurement technique may be used on a semiconductor wafer either before or after processing, but the technique can be very slow. For example, the frequency of the superimposed square waveform must be done at very high frequencies. For example, frequencies above 1MHz are typically used and a measurement of capacitance decay over time takes hundreds and even thousands of seconds.

A method of using the apparatus of FIG. 3 is shown in FIG. 4. First, in step 252 the carriers in the silicon substrate are excited with a constant frequency DC biased square wave from the waveform generator 119. Next, in step 254 the capacitance measurement device 118 measures the capacitance across the wafer as a function of time. In step 256 the carrier lifetime $\tau$ is determined based upon the capacitance decay. Once the carrier lifetime $\tau$ has been determined, in step 258 the concentration of metallic impurities may be calculated by using the impurity concentration formula $N=\alpha/\tau$.

However, because this electrical technique relies upon measuring the capacitance decay across the substrate and oxide layer in order to determine the carrier lifetime, it can take on the order of a number of minutes to measure this capacitance decay. This length of time for a measurement is undesirable since it delays the processing of the wafer. In addition, the calculation time for this technique is also slow. Lower frequencies between 100 Hz and 1 MHz are not used in the prior art for this process.

Thus, prior art measurement techniques for calculating the concentration of metallic impurities that are based upon measuring carrier lifetimes have numerous disadvantages. As discussed above, optical techniques may result in inaccurate measurements because the measured lifetime of the carriers may not be a true lifetime. Capacitance-time techniques are slow for measurement and for calculation. Thus, a measurement technique for measuring concentrations of impurities in semiconductors that is accurate, economical and fast is desirable.

SUMMARY OF THE INVENTION

The present invention avoids problems with prior art measurement techniques by not relying upon measuring carrier lifetimes. The present invention calculates the total capacitance of a device as a function of a changing frequency which is not only accurate, but also quicker than the prior art techniques. A capacitance versus frequency measurement of the process of the present invention may be made on the order of a few seconds. The capacitance-frequency technique of this invention does not rely upon measured carrier lifetimes and, therefore, it is more accurate for measuring metallic impurities in relatively thin wafers than prior art optical techniques.

In a method aspect of the present invention, an impurity concentration in a semiconductor substrate having an insulating layer is measured. First, the carriers in the semiconductor substrate are excited using a DC biased, varying frequency signal. The capacitance across the semiconductor substrate and the insulating layer are then measured as a function of the varying frequency signal. This measurement results in a capacitance versus frequency curve that may be stored, displayed or plotted, and then analyzed. Once the curve is developed, a bandwidth at a representative point on the capacitance versus frequency curve is determined. The impurity concentration is calculated based upon the determined bandwidth.

An apparatus of the present invention for measuring an impurity concentration in a semiconductor substrate having at least one insulating layer includes a varying frequency waveform generator capable of producing a varying frequency signal. This varying frequency signal is DC biased by a voltage bias generator connected in series with the varying frequency waveform generator. The resulting signal is applied across the semiconductor substrate and insulating layer. A capacitance measuring device measures the capacitance across the semiconductor substrate and insulating layer as a function of the varying frequency signal. This measurement develops a capacitance versus frequency curve or equivalent data for analysis. Once the curve is developed, a bandwidth is determined at a representative point on the capacitance versus frequency curve that is used to calculate the impurity concentration.

In other embodiments, the varying frequency waveform generator produces a relatively low frequency signal varying between about 100 Hz and about 1MHz. The voltage bias generator produces a DC voltage in the range of about positive two to three volts for p-type substrate and negative two to three volts for n-type substrate. The impurity concentration N is calculated by using the formula $N=G*BW$ where G is a correlation constant and BW is the bandwidth determined at a representative point on the capacitance versus frequency curve.

Developing a capacitance versus frequency curve by the process and apparatus of the present invention is quicker than the prior art electrical method because capacitance is being sampled at a point in time in a rapidly varying frequency, instead of by plotting capacitance versus time. Also, the present invention is more accurate than the prior art optical technique because it does not rely upon a direct, and possibly inaccurate measurement of carrier lifetimes.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention relates to a method for evaluating contamination of semiconductors using a capacitance-frequency measurement on MOS structures. An advantage of this method is that it can utilize conventional capacitance-voltage measurement equipment, and requires short measurement times. It can be used on finished product wafers (by implementing it on contacting capacitance-voltage measurement systems) or as a routine monitoring tool (by implementing it on non-contacting capacitance-voltage systems).

The contamination concentration N is derived from the formula N=G×BW, where G is the correlation constant. With an a priori knowledge of contamination concentration, N, the constant G may be derived by measuring a bandwidth of the capacitance versus frequency curve. Once the constant G is determined, future evaluation of N can be made by a capacitance measurement using the technique of the present invention. The present invention is applicable to wide variety of semiconductors. By way of example, the examples below show the present invention used with a silicon semiconductor. Also, a wide variety of impurities may be monitored using the present invention. By way of example, any impurity with an energy level that falls in the middle of the band gap of the semiconductor in which the impurity is found may be monitored using the present invention. In particular, the transition metals are most commonly found as impurities, and specifically, Iron, Copper and Aluminum may be monitored using the present invention.

Figure 1:
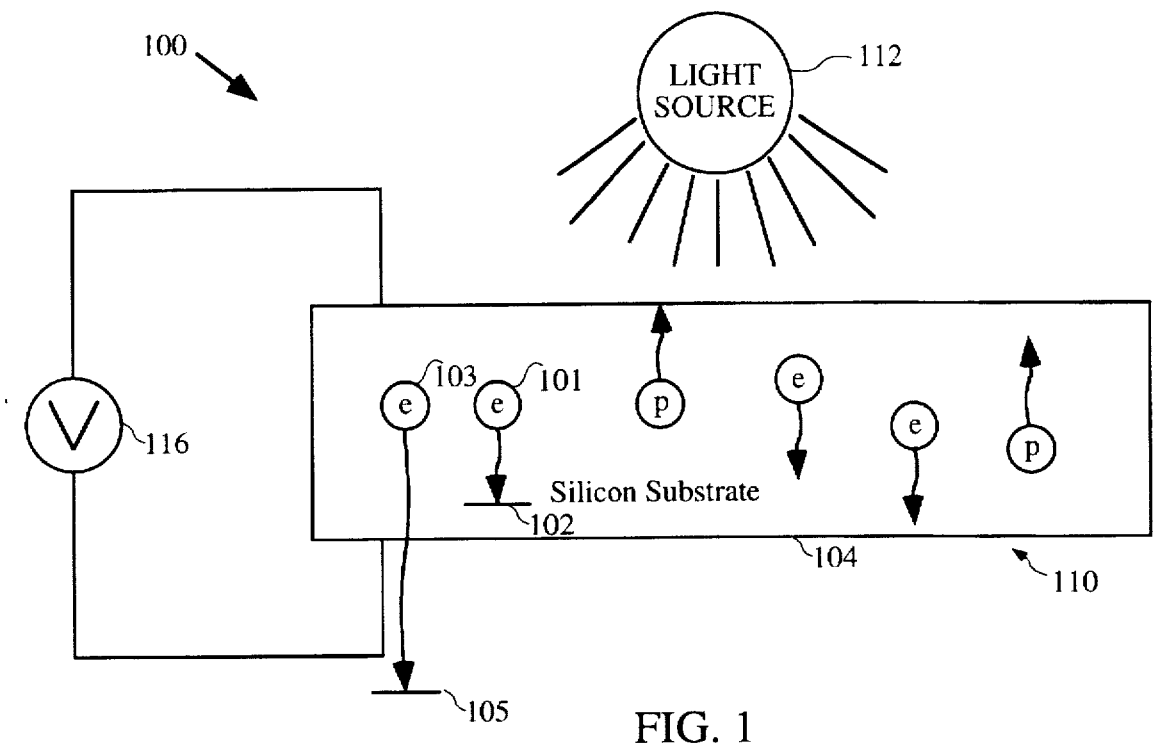
FIG. 1 illustrates a prior art optical technique for measuring impurities in a semiconductor based upon measuring carrier lifetimes.
Figure 3:
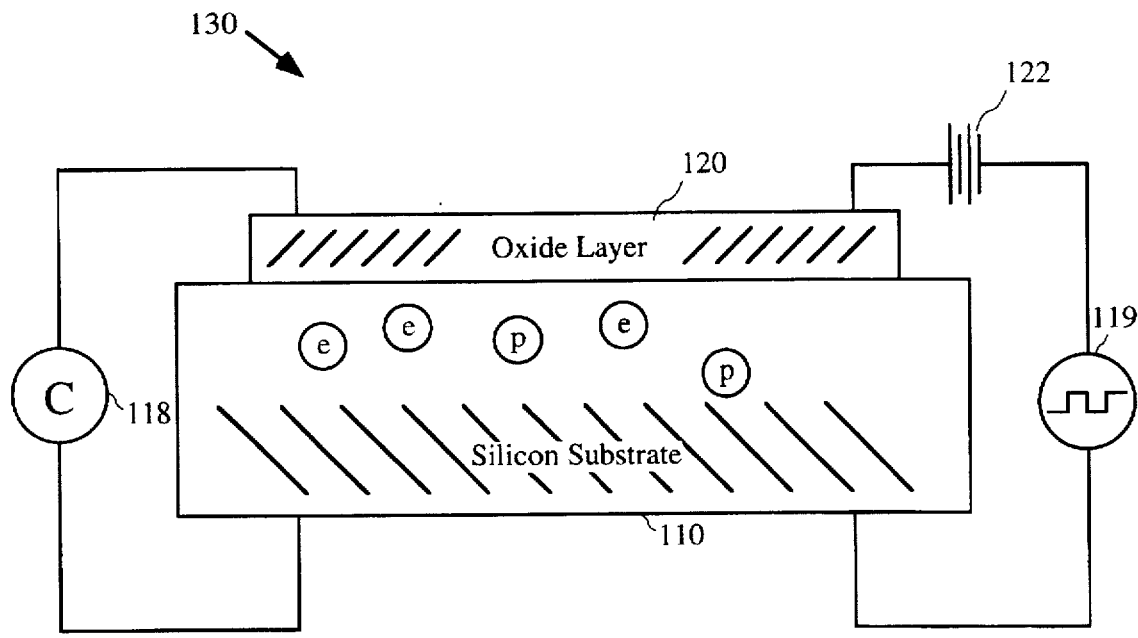
FIG. 3 illustrates a prior art electrical technique for measuring impurities in a semiconductor based upon measuring carrier lifetimes.
Figure 2:
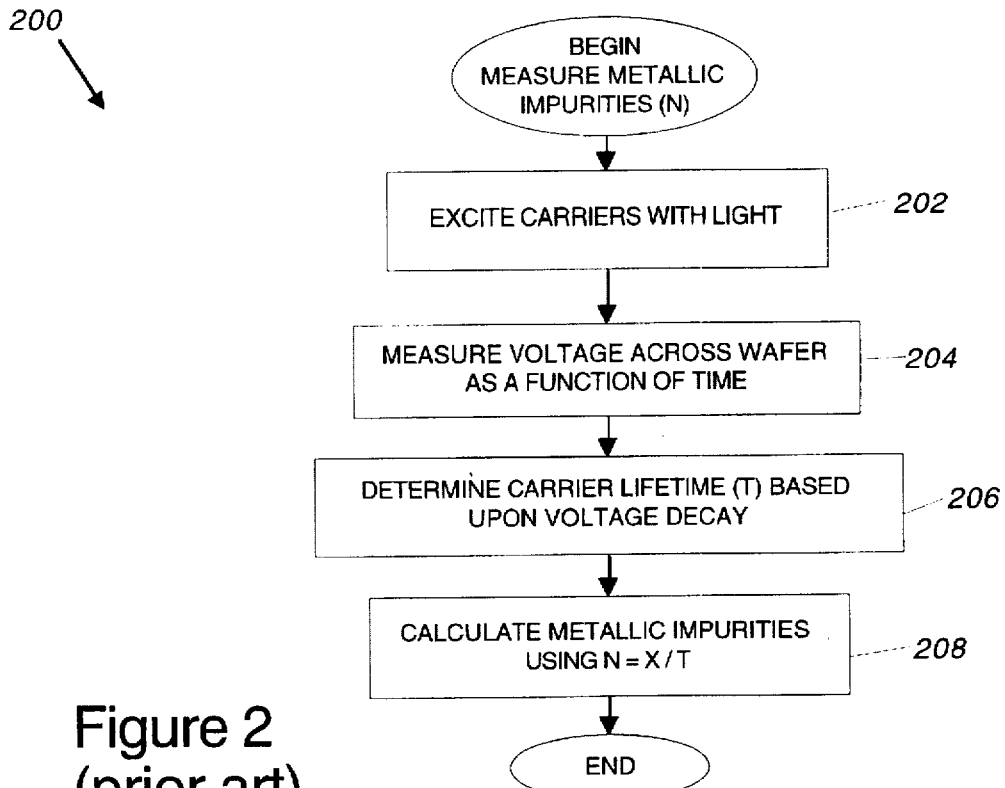
FIG. 2 shows a flow chart for implementing the prior art optical measuring technique of FIG. 1.
Figure 4:
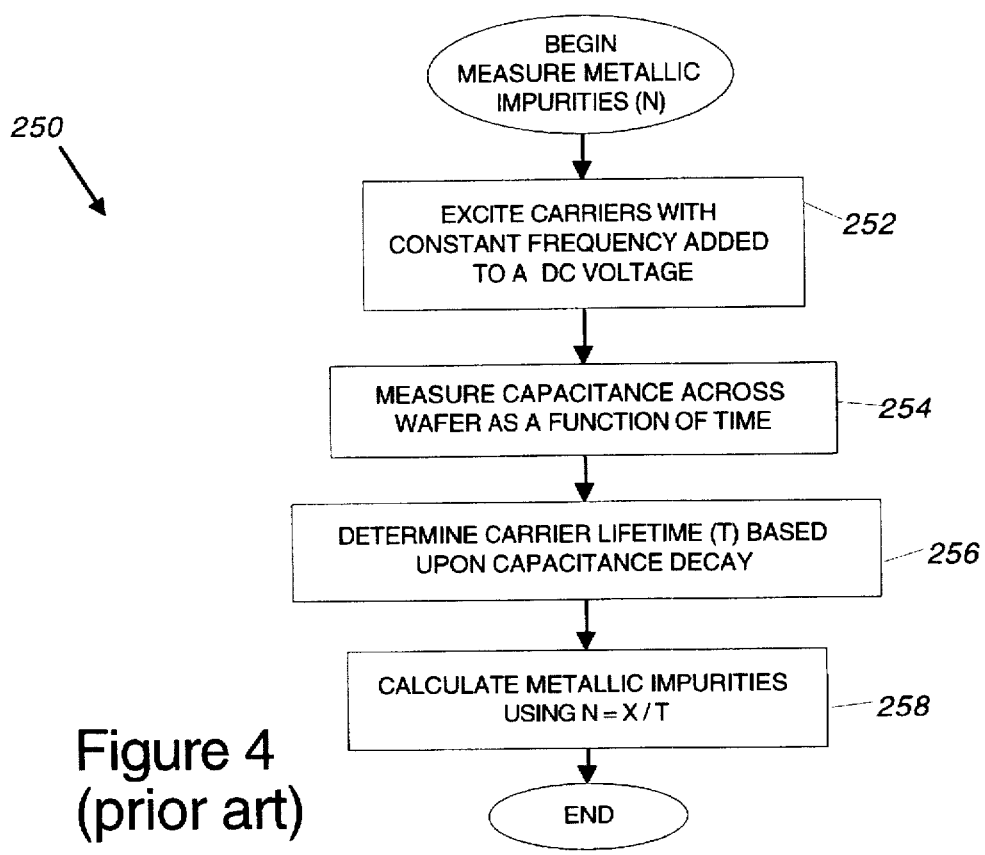
FIG. 4 shows a flow chart for implementing the prior art electrical technique of FIG. 3.
Figure 5:
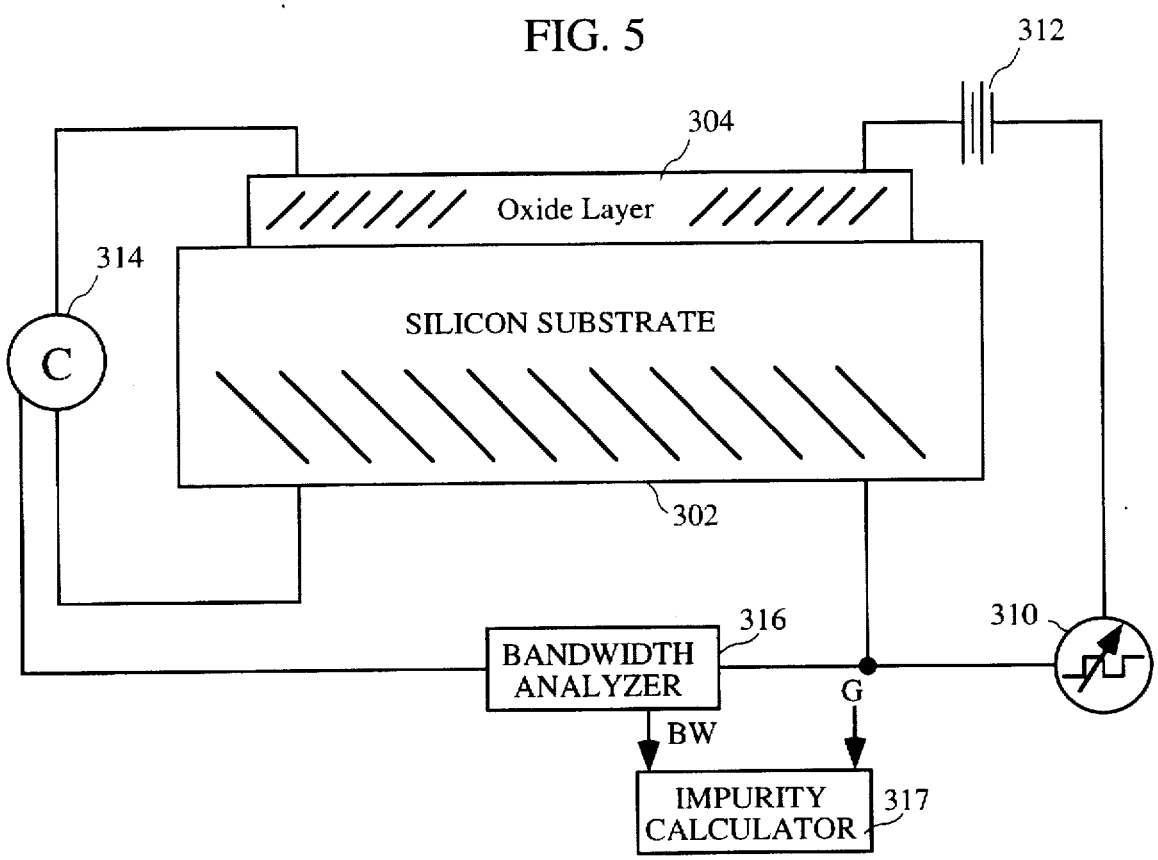
FIG. 5 illustrates an embodiment of the present invention in which a varying frequency waveform is applied to a semiconductor.

FIG. 5 illustrates an embodiment of the present invention in which a capacitance versus frequency graph is developed in order to calculate the metallic impurities present in a silicon substrate. Alternatively, instead of developing a graph, data may be produced for later analysis, fed directly into a computer, etc. Shown in FIG. 5 is a silicon substrate 302 with at least one oxide layer 304. It is contemplated that a wide variety of insulating layers may be used on the semiconductor substrate. By way of example, this insulating layer may be an oxide, a nitride, spin-on glass (SOG), or other. Preferably, the present invention is used with an oxide as the insulating layer.

A varying frequency waveform generator 310 is biased with a DC voltage 312 and is applied across the silicon substrate and oxide layer. Any suitable waveform generator may be used. By way of example, in one embodiment of the present invention the waveform generator 310 is composed of a low frequency waveform generator and a high frequency waveform generator. An HP 4140 CV meter available from Hewlett-Packard Company may be used as the low frequency generator. An HP 4284 CV meter may be used as the high frequency generator. A computer may be used to switch between applying one of the two frequency generators as the frequency is swept from low to high frequencies. In one embodiment, an HP 4083A electronic switch may be controlled by the computer in order to perform the switching between the two frequency generators. The HP 4140 and HP 4284 may also be used to provide the DC voltage 312 and to perform the role of the capacitance measurement device 314.

The waveform generator 310 may produce a waveform of any suitable shape. By way of example, a square waveform or sinusoidal waveform are preferable, although sawtooth and other waveforms are also suitable. The biasing voltage 312 produces a constant DC voltage bias used to bias the device into the inversion region. Preferably, the bias is greater than positive one volt for p-type substrate and greater than minus one volt for n-type substrate. More preferably, the voltage bias generator produces a DC voltage in the range of about positive two to three volts for p-type substrate and negative two to three volts for n-type substrate. The bias range will depend upon the oxide thickness and the substrate concentration.

The waveform generator can be coupled to the oxide layer and substrate in any suitable manner. By way of example, the generator may be coupled via a metallic probe or the like to a finished wafer or to an individual device. Alternatively, for an unprocessed wafer, the generator may be coupled via a mercury probe or the like.

A capacitance measurement device 314 is used to measure the capacitance across the silicon substrate and oxide layer in relation to the changing frequency produced by the waveform generator 310. Any suitable capacitance measurement device may be used. By way of example, in one embodiment either of the HP 4140 or the HP 4284 may be also used to measure the capacitance. Also shown is a bandwidth analyzer 316 that takes as an input an output of the capacitance measurement device 314 and the output of the waveform generator 310. In this fashion, the bandwidth analyzer is used to calculate a bandwidth for the capacitance versus frequency curve in order to calculate the concentration of metallic impurities as will be explained below with reference to FIG. 7. Any suitable bandwidth analyzer may be used. For example, an oscilloscope, a discrete logic device, a personal computer or a neural network may be used.

Figure 8:
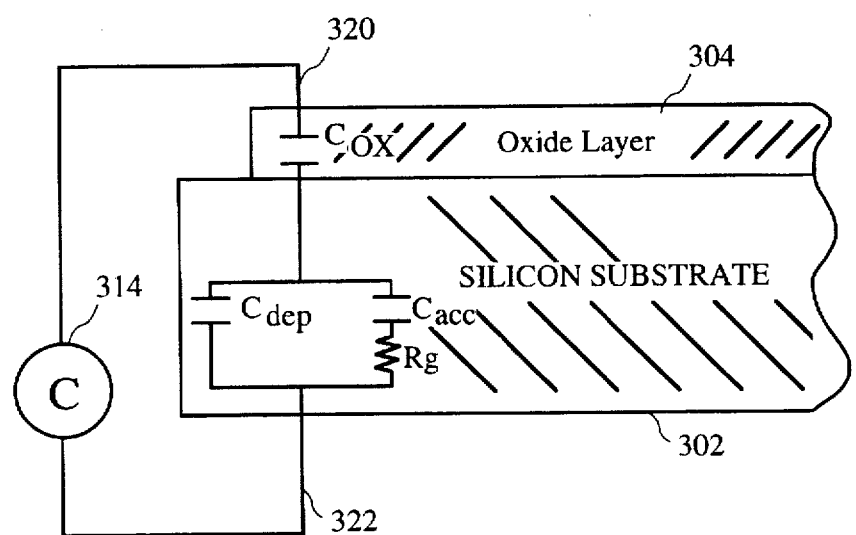
FIG. 8 shows a circuit modeling the capacitance of the silicon substrate and oxide layer of FIG. 5.
Figure 6:
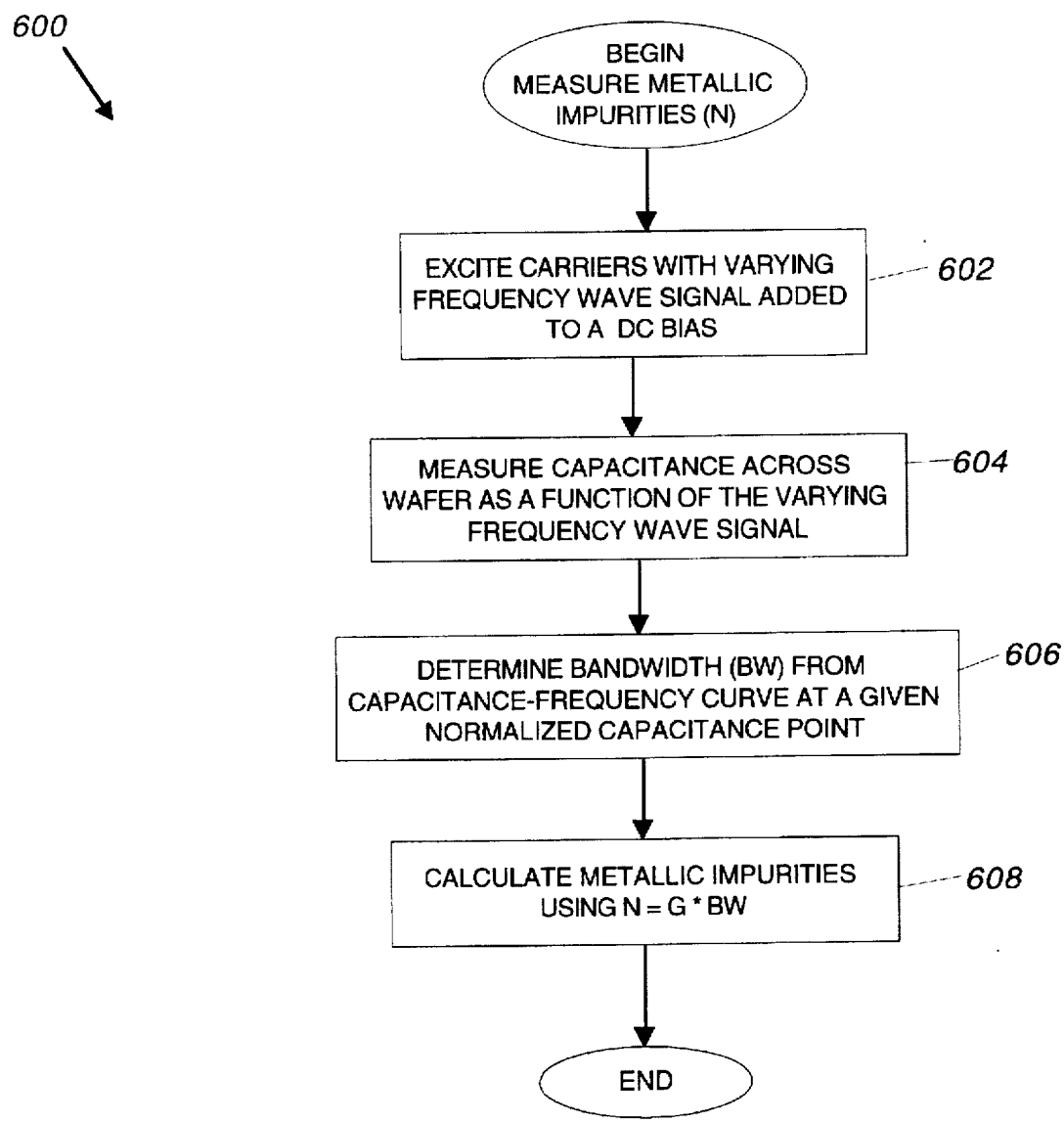
FIG. 6 is a flow chart for calculating impurities in a semiconductor using the device of FIG. 5 according to one embodiment of the invention.

FIG. 6 is a flow chart describing steps in an embodiment of the present invention that are used to calculate metallic impurities in a silicon substrate using the device as shown in FIG. 5. In a first step 602, the carriers in the silicon substrate are excited using the DC biased varying frequency signal. In step 604, the capacitance across the wafer is measured as a function of this varying frequency signal. Because an increase in frequency results in a decay of the total capacitance of the device, a capacitance-frequency curve is developed. Alternatively, data for digital processing may be produced. This capacitance versus frequency measurement may also be displayed in a graph as shown in FIG. 8 which will be explained in more detail below. In step 606 the bandwidth from the capacitance frequency curve is determined at a given normalized capacitance point. Next, once this bandwidth has been determined, then the concentration of metallic impurities in the silicon substrate may be calculated based upon this bandwidth. The formula used for this calculation is N=G*BW, where "N" is the concentration of metallic impurities in units of atoms/cubic centimeter, "G" is a correlation coefficient and "BW" is the bandwidth in Hertz determined in step 606 above.

The calculation of the novel formula N=G*BW in order to determine the concentration of metallic impurities may be performed by a wide variety of techniques. By way of example, an analog-to-digital converter may be used to input the bandwidth BW from a measuring device to an impurity calculator (such as a computer) in order to multiply it by the constant G. Also, dedicated analog or digital circuitry may be used as an impurity calculator 317 to input both the bandwidth and the constant G in order to determine N. In addition, a user may manually read an oscilloscope in order to determine the capacitance frequency curve and thus determine the bandwidth. This bandwidth may then be used to calculate the impurities using any suitable method or device.

Figure 7:
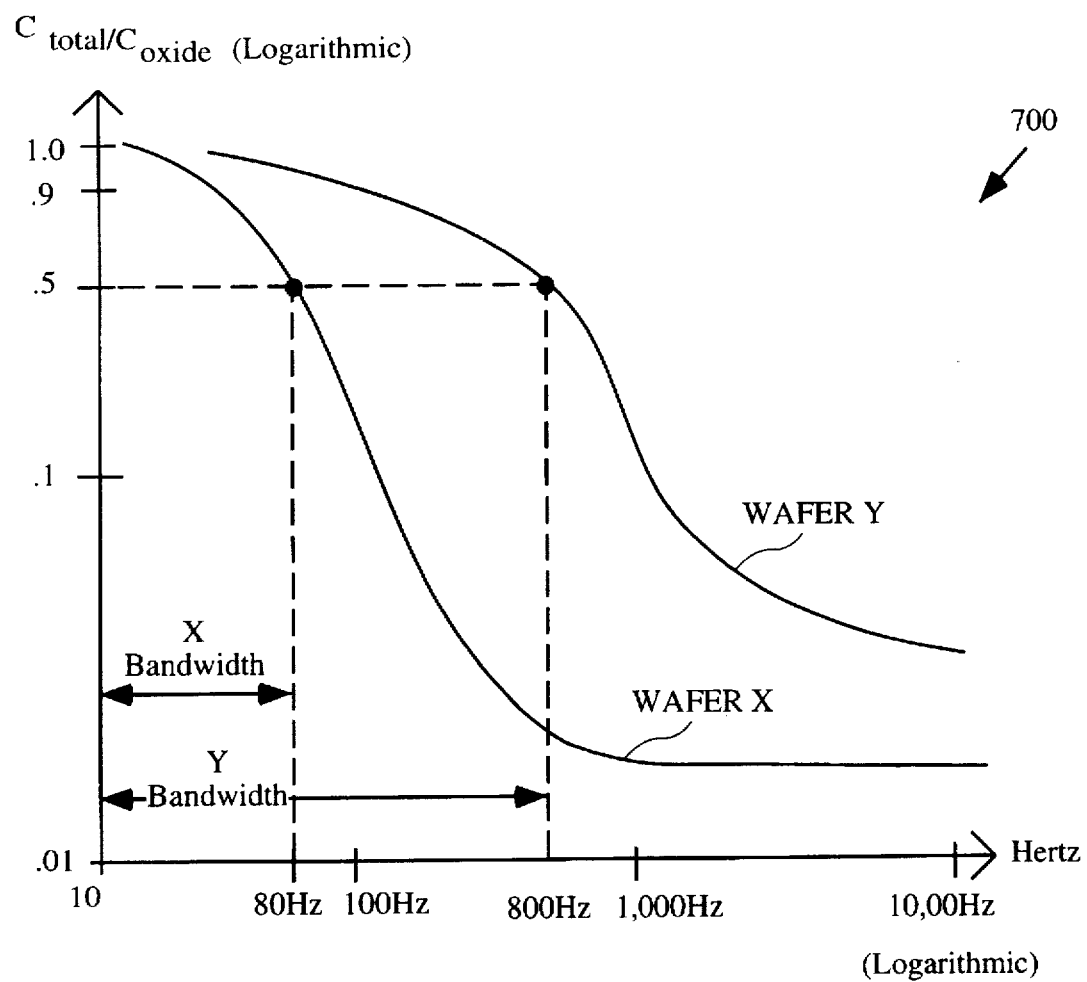
FIG. 7 is a plot of the total capacitance versus a changing frequency used in the calculation of the bandwidth for a particular wafer.

A graph such as shown in FIG. 7 may be developed empirically or by using a circuit modeling a wafer. FIG. 8 illustrates a schematic representation of a circuit modeling the capacitance of the silicon substrate 302 and the oxide layer 304 of FIG. 5. The capacitance is measured by the capacitance measuring device 314 between point 320 and point 322. This circuit may be used as a model upon which the curve of FIG. 8 is based.

The meaning of each equivalent circuit element in FIG. 8 will now be described. The capacitor $CO_{ox}$ represents the capacitance of the oxide layer 304. The capacitor $C_{dep}$ represents the capacitance of the depletion layer in the silicon substrate 302. The capacitor $C_{acc}$ represents the capacitance of the accumulation layer in the silicon substrate. The resistance Rg varies as the average carrier lifetime varies. A formula for calculating Rg is the quantity $(\tau_g/n_i*A)$ multiplied by the square root of the quantity $((2N_a*V_s)/q*\epsilon_s))$. The variables in the above formula for Rg have the following meaning. The variable $N_a$ represents the background doping concentration of the silicon substrate. The variable $V_s$ represents the voltage across the silicon substrate and the oxide layer. The variable q is the electron charge. The variable $\epsilon_s$ is the dielectric constant of silicon. The variable $\tau_g$ represents the average carrier lifetime. The variable $n_i$ is the concentration of carriers in pure silicon, and the variable A is the surface area of the oxide layer.

FIG. 7 shows a graph 700 of a capacitance versus frequency curve representative of the capacitance response of a wafer undergoing monitoring for contaminants. The graph plots capacitance along a logarithmic vertical scale and a varying frequency plotted along a logarithmic horizontal scale. Preferably, the vertical capacitance scale is the total capacitance of the silicon substrate plus the oxide layer divided by the capacitance of the oxide layer. This division of the total capacitance by the capacitance of just the oxide layer is used to normalize the capacitance value in order to compare wafers.

Shown in FIG. 7 are the capacitance versus frequency plots for two different wafers X and Y. Preferably, capacitance values are measured empirically and then plotted to form such a curve. Capacitance may be sampled in any suitable fashion in order to form the capacitance frequency curve. Preferably, three points within each frequency decade are sampled in order to form the curve. Fewer points calculated may lead to a less accurate measurement, whereas more points sampled will lead to a longer measurement time. FIG. 7 represents the result of performing step 604 of FIG. 6. That is, once capacitance has been measured as a function of frequency for a wafer X, a curve such as that shown for wafer X in FIG. 7 can be developed. Once this curve has been developed, a bandwidth (BW) from the curve is determined in order to calculate the impurity concentration. For different wafers with differing levels of impurities, the curves will be different. This is because carrier lifetimes are affected by higher levels of impurities, and a change in carrier lifetimes in turn affects the capacitance of the wafer.

As described in step 606 of FIG. 6, the bandwidth (BW) for a given wafer may be measured at any normalized capacitance point along the vertical axis. A normalized capacitance point may be defined as the point where the total capacitance drops to a certain percentage of the oxide capacitance. A common point to measure bandwidth is at 70%, and preferably bandwidth is measured at 50%, or at 0.5 along the vertical scale. Measuring bandwidth at a very high percentage point may give similar readings for two different wafers that actually have quite different concentrations of impurities, whereas measuring at an extremely low percentage point may give an incorrect result because the curves might cross one another. For example, for the wafer X, the bandwidth measured at a normalized capacitance point of 0.5 yields a bandwidth result of 80 Hz. Likewise, a bandwidth measurement for wafer Y at the normalized capacitance point of 0.5 yields a result of 800 Hz. It can be seen that for two different wafers two different bandwidth results are calculated. It can also be seen from the graph that if these bandwidths were calculated closer to 100% or closer to 0% that the bandwidth results would be incorrectly very similar and may result in an inaccurate measurement of impurities.

Once the bandwidth BW has been determined, then the metallic impurity concentration N may be determined by using the formula N=G*BW of the present invention. The quantity G is a constant value that may be determined empirically or through the use of the prior art impurity concentration formula. For example, using the prior art formula, it is known that for a given wafer the metallic impurity concentration $N=\alpha/\tau$. Since the present invention uses the formula N=G*BW, we may calculate a value for G as $G=\alpha/(\tau*BW)$. Thus, for a given wafer the constant α may be plugged into this derived formula, a value for τ may be measured using any standard technique, and a measured bandwidth at a particular normalized capacitance point may be inserted for the value BW. In this fashion, the constant G may be determined for a given normalized capacitance point. This constant G may then be used in subsequent calculations of impurities in other wafers.

Although the foregoing invention has been described in some detail for purposes of clarity of understanding, it will be apparent that certain changes and modifications may be practiced within the scope of the appended claims. For instance, the invention may be practiced upon any suitable semiconductor and used to detect various types of impurities. Also, any suitable method for applying a biased, changing frequency waveform to the wafer may be used, and capacitance may be measured with a variety of devices. Furthermore, the bandwidth may be determined from the capacitance-frequency curve using a variety of techniques. Therefore, the described embodiments should be taken as illustrative and not restrictive, and the invention should not be limited to the details given herein but should be defined by the following claims and their full scope of equivalents.

I claim:

1. A method of measuring an impurity concentration in a semiconductor substrate having charge carriers, said semiconductor substrate provided with an insulating layer, the method comprising:

coupling the series connection of a biasing voltage source and a variable frequency signal source across said semiconductor substrate and said insulating layer such that said charge carriers in said semiconductor substrate are induced into an excited state;

varying the frequency of said signal source within a range of frequencies and measuring the capacitance across said semiconductor substrate and said insulating layer at a plurality of associated frequencies within said range of frequencies;

determining a bandwidth for a particular measured capacitance from its associated frequency; and calculating said impurity concentration based upon said determined bandwidth.

2. A method as recited in claim 1 wherein said semiconductor substrate is of silicon and said insulating layer is an oxide.

3. A method as recited in claim 1 wherein said varying frequency signal varies in frequency from about 100 Hz to about 1MHz.

4. A method as recited in claim 3 wherein said substrate is a p-type substrate and said biasing voltage source is in the range of from about 2 volts to about 3 volts.

5. A method as recited in claim 3 wherein said substrate is an n-type substrate and said biasing voltage source is in the range of from about negative 2 volts to about negative 3 volts.

6. A method as recited in claim 3 wherein said impurity concentration is calculated by multiplying said bandwidth by a constant value.

7. A method as recited in claim 1 wherein said impurity concentration is calculated by multiplying said bandwidth by a constant value.

8. A method as recited in claim 7 wherein said impurity concentration is calculated by using the formula N=G*BW, where N is the impurity concentration, G is the constant value and BW is the bandwidth.

9. A method as recited in claim 8 wherein the constant G is calculated by using the formula $G=\alpha/(\tau*BW)$.

10. An apparatus for measuring an impurity concentration in a semiconductor substrate having charge carriers, said semiconductor substrate provided with an insulating layer, the apparatus comprising:

a variable frequency waveform generator producing a varying frequency signal;

means for coupling said varying frequency signal across said semiconductor substrate said insulating layer; and a capacitance measuring device coupled across said semiconductor substrate and said insulating layer to measure capacitance at a plurality of associated frequencies within a range of frequencies, where a bandwidth is related to an associated frequency at a selected capacitance; and means for calculating said impurity concentration based upon said bandwidth for said semiconductor substrate.

11. An apparatus as recited in claim 10 wherein said varying frequency signal varies in frequency from about 100 Hz to about 1 MHz.

12. An apparatus as recited in claim 10 further including a biasing voltage source connected in series with said variable frequency waveform generator.

13. An apparatus as recited in claim 12 wherein said substrate is a p-type substrate and said biasing voltage source is in the range of from about 2 volts to about 3 volts.

14. An apparatus as recited in claim 12 wherein said substrate is an n-type substrate and said biasing voltage source is in the range of from about negative 2 volts to about negative 3 volts.

15. An apparatus as recited in claim 10 wherein said impurity concentration is calculated by multiplying said bandwidth by a constant value.

16. An apparatus as recited in claim 15 wherein said impurity concentration is calculated by using the formula N=G*BW, where N is the impurity concentration, G is the constant value and BW is the bandwidth.

17. An apparatus as recited in claim 16 wherein the constant G is calculated by using the formula $G=\alpha/(\tau*BW)$.

18. An apparatus as recited in claim 12 wherein said impurity concentration is calculated by multiplying said bandwidth by a constant value.

19. An apparatus as recited in claim 18 wherein said impurity concentration is calculated by using the formula N=G*BW, where N is the impurity concentration, G is the constant value and BW is the bandwidth.

20. An apparatus as recited in claim 19 wherein the constant G is calculated by using the formula $G=\alpha/(\tau*BW)$.

21. A semiconductor device made by a process including a testing of a semiconductor substrate of the device having charge carriers, said semiconductor substrate provided with an insulating layer, said testing including:

coupling the series connection of a biasing voltage source and a variable frequency signal source across said semiconductor substrate and said insulating layer such that said charge carriers in said semiconductor substrate are induced into an excited state;

varying the frequency of said signal source within a range of frequencies and measuring the capacitance across said semiconductor substrate and said insulating layer at a plurality of associated frequencies within said range of frequencies;

determining a bandwidth for a particular measured capacitance from its associated frequency; and calculating said impurity concentration based upon said determined bandwidth.

22. A semiconductor device made by the process of claim 21, the process further including the step of discarding said device if the impurity concentration is higher than allowable based upon processing heuristics.

* * * * *